US007091554B2

(12) United States Patent
Muraoka et al.

(10) Patent No.: US 7,091,554 B2
(45) Date of Patent: Aug. 15, 2006

(54) SEMICONDUCTOR DEVICE

(75) Inventors: Hiroki Muraoka, Hyogo-ken (JP);
Hidetoshi Nakanishi, Hyogo-ken (JP);
Tetsujiro Tsunoda, Saitama-ken (JP);
Shinichi Umekawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/740,676

(22) Filed: Dec. 22, 2003

(65) Prior Publication Data

US 2004/0183128 A1 Sep. 23, 2004

(30) Foreign Application Priority Data

Dec. 20, 2002 (JP) ............................. P2002-369258

(51) Int. Cl.
*H01L 29/76* (2006.01)
*H01L 23/62* (2006.01)
*H01L 29/94* (2006.01)

(52) U.S. Cl. ...................... 257/330; 257/331; 257/355; 257/369; 257/368; 257/370

(58) Field of Classification Search ................ 257/369, 257/370, 368, 355
See application file for complete search history.

(56) References Cited

U.S. PATENT DOCUMENTS 5,468,982 A * 11/1995 Hshieh et al. ............... 257/331

5,998,837 A * 12/1999 Williams .................... 257/341

FOREIGN PATENT DOCUMENTS

| JP | 2000-216385 | 8/2000 |
|---|---|---|
| JP | 2001-168329 | 6/2001 |

OTHER PUBLICATIONS

U.S. Appl. No. 10/740,676, filed Dec. 22, 2003, Muraoka et al.
U.S. Appl. No. 09/525,055, filed Mar. 14, 2000, Muraoka et al.

* cited by examiner

*Primary Examiner*—Eddie Lee
*Assistant Examiner*—Samuel A Gebremariam
(74) *Attorney, Agent, or Firm*—Oblon, Spivak, McClelland, Maier & Neustadt, P.C.

(57) ABSTRACT

A semiconductor device with high turn off capability includes a plurality of stripe trench lines which are provided in each of adjacent cell regions of a semiconductor layer in parallel and extended from one cell region toward the other cell region, a gate insulating film formed in each of the trench lines, and a gate electrode embedded in each of the trench lines with the gate insulating film interposed therebetween. In this semiconductor device, in each of the cell regions, part of adjacent ends of the plurality of trench lines on a side of the other cell region are connected to each other by connecting portions, and portions between the remaining adjacent ends are open. Moreover, at least one of the connecting portions of one cell region faces one of the open portions of the other cell region.

11 Claims, 5 Drawing Sheets

SEMICONDUCTOR DEVICE

CROSS REFFERENCE TO RELATED APPLICATION

This application is based upon and claims the benefit of priority under 35 § 119 to Japanese Patent Application No. 2002-369258, filed on Dec. 20, 2002; the entire contents of which are incorporated by references herein.

BACKGROUND OF THE INVENTION

1. Field of the Invention

The present invention relates to a semiconductor device including a trench gate structure typified by a vertical field effect transistor, and specifically relates to a semiconductor device provided with a structure suitable for increasing a turn off capability or latch-up immunity.

2. Description of the Related Art

For higher electric power in power semiconductor devices, there has been an increasing demand for reduction in loss and increase in current capacity of elements, recently.

To reduce the loss of the elements, it is important to reduce an on-voltage, and trench insulated gate bipolar transistors (hereinafter, referred to as trench IGBTs), which are vertical field effect transistors advantageous in low on-voltage characteristics, is often used. To increase the current capacity of elements, it is required to increase chip size, and chips with a size of not less than 1 cm square are used.

However, when the chip size is increased, there is a problem that gate resistance is increased because a trench IGBT cell is distanced from a gate terminal lead section and the switching loss is increased.

Therefore, the trench IGBT cell is divided into a plurality of cells, and gate wiring sections are provided on peripheries of the divided trench IGBT cells as well as on the periphery of the chip to reduce the gate resistance.

In the trench IGBT, a trench pattern is formed in a semiconductor layer, and a gate electrode is embedded in the trench pattern with a gate insulating film interposed therebetween. For the trench pattern, a stripe structure in which a plurality of parallel trench lines are formed has hitherto been often used.

In the trench pattern of this stripe structure, both ends of each trench line are unconnected, so that dislocations caused by oxidation-induced stress tend to be generated in the vicinity of each end.

As shown in Japanese Patent Laid-Open Publication [KOKAI] Hei 10-256545, there has been known a semiconductor device including a trench pattern to solve this problem.

A description will be given of a trench pattern of a semiconductor device disclosed in the Publication with reference to FIG. 4. FIG. 4 is a conceptual view showing a main portion of the semiconductor device.

As shown in the drawing, an end 102a of a trench line 101a is bifurcated and integrally connected to ends 102b and 102c of trench lines 101b and 101c adjacent to both sides of the trench line 101a with connecting portions 103a and 103b interposed therebetween, respectively. Accordingly, a viscous flow of the gate insulating film is not blocked, therefore the oxidation-induced stress is reduced and the generation of dislocations is suppressed.

FIGS. 5A and 5B are views showing an example of the trench IGBT using the trench pattern disclosed in the Publication. FIG. 5A is a plan view showing two trench IGBT cells horizontally separated, and FIG. 5B is a cross-sectional view taken along a line C—C of FIG. 5A and viewed in a direction of an arrow. Electrode wires not shown in FIG. 5A are shown in FIG. 5B.

As shown in the drawings, an end 112a of a trench line 111 is integrally connected to ends 112b and 112c of trench lines adjacent to the both sides of the trench line 111 with connecting portions 113a and 113b interposed therebetween, respectively.

However, a trench IGBT 115 composed of trench IGBT cells 114a and 114b, each having the trench pattern disclosed in the Publication, has a problem. When the trench IGBT 115 is turned on, holes injected into an n-type layer 117 through a P+ type semiconductor substrate 116 are accumulated in a region directly under a gate wire 118 sandwiched between the adjacent trench IGBT cells 114a and 114b. When the trench IGBT 115 is turned off, the accumulated holes remain to cause malfunction of the trench IGBT 115.

These accumulated holes should be discharged through emitter electrodes 119a and 119b of the nearest trench IGBT cells. However, current paths between the emitter electrodes 119a and 119b and the region directly under the gate wire 118, in which the holes are accumulated, are divided by trenches 120a and 120b, therefore holes are difficult to be discharged.

Therefore, the holes remaining in the region directly under the gate wire 118 activates an NPN transistor (NPN transistor formed of an N+ type emitter layer 121, a P type base layer 122, and an N− type layer 117) in the vicinity thereof to cause malfunction of the trench IGBT 115.

Accordingly, in the IGBT with the trench pattern disclosed in the Publication, in which the end of a trench line is connected to the ends of the trench lines adjacent to both sides thereof, the latch-up immunity is lowered, and elements could be broken. Therefore, increasing the current capacity is difficult.

In the aforementioned IGBT with the stripe trench pattern, high gate voltage withstand capability cannot be obtained. On the other hand, the IGBT with the trench pattern disclosed in the Publication has the problem with the latch-up immunity. In other words, it has been difficult that the conventional trench IGBT satisfies both the gate voltage withstand capability and the latch-up immunity when the chip size is increased.

SUMMARY OF THE INVENTION

First aspect of a semiconductor device according to an embodiment of the present invention comprises: a plurality of stripe trench lines which are provided in each of adjacent cell regions of a semiconductor layer in parallel and extended from one cell region toward the other cell region; a gate insulating film formed in each of the trench lines; and a gate electrode embedded in each of the trench lines with the gate insulating film interposed therebetween. In the semiconductor device, in each of the cell regions, part of adjacent ends of the plurality of trench lines on a side of the other cell region are connected to each other by connecting portions, and portions between the remaining adjacent ends are open. Moreover, at least one of the connecting portions of one cell region faces one of the open portions of the other cell region.

Second aspect of a semiconductor device according to an embodiment of the present invention comprises: a plurality of frame trenches, in which adjacent both ends of a plurality of stripe trench lines are respectively connected to each other, the plurality of stripe trench lines being provided in each of adjacent cell regions of a semiconductor layer in parallel and extended from one cell region toward the other cell region; a gate insulating film formed in each of the plurality of frame trenches; and a gate electrode embedded in each of the plurality of frame trenches with the gate insulating film interposed therebetween. In the semiconductor device, in each of the cell regions, ends on one side of the adjacent frame trenches and ends on the other side thereof are alternately connected by connecting portions, and the connecting portions of one cell region face relevant unconnected portions of the other cell region.

Third aspect of a semiconductor device according to an embodiment of the present invention comprises: a plurality of stripe trench lines which are provided in each of adjacent cell regions of a semiconductor layer in parallel and extended from one cell region toward the other cell region; a gate insulating film formed in each of the plurality of trench lines; and a gate electrode embedded in each of the plurality of trench lines with the gate insulating film interposed therebetween. In the semiconductor device, in each of the cell regions, both ends of adjacent outer trench lines are respectively connected to each other to form frame shapes, ends on one side of the adjacent inner trench lines and ends on the other side thereof are alternately connected by connecting portions of one cell region face relevant unconnected portions of the other cell region.

BREIF DESCRIPTION OF THE DRAWINGS

DETAILED DESCRIPTION OF THE INVENTION

Hereinafter, a description will be given of embodiments of the present invention with reference to the drawings.

First Embodiment

Figure 1:
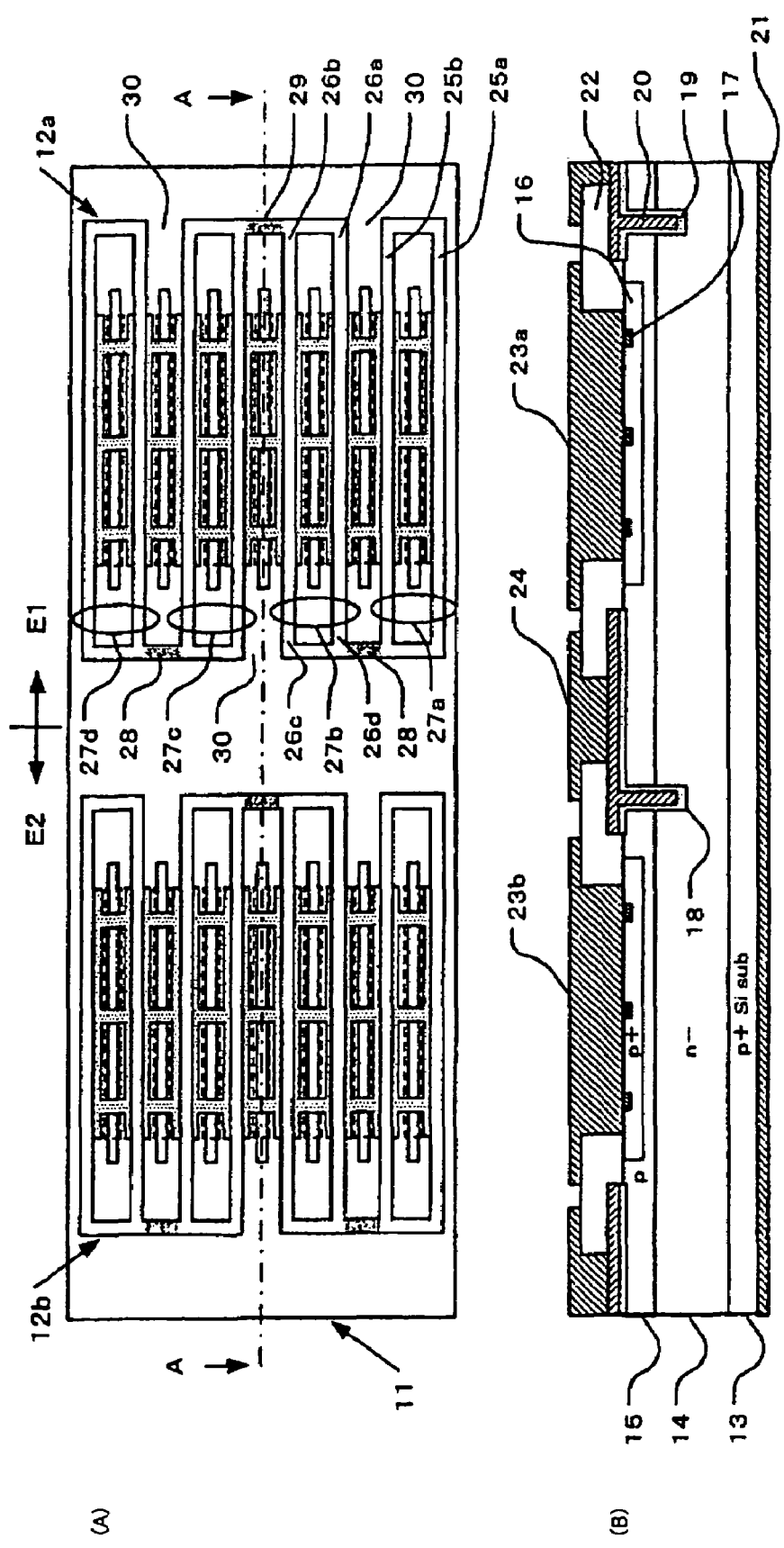
FIGS. 1A and 1B are views showing a trench IGBT according to a first embodiment of the present invention, FIG. 1A being a plan view, and FIG. 1B being a cross-sectional view taken along a line A—A of FIG. 1A.

FIGS. 1A and 1B are views showing a semiconductor device according to a first embodiment of the present invention. FIG. 1A is a plan view of a trench IGBT, and FIG. 1B is a cross-sectional view taken along a line A—A of FIG. 1A and viewed in a direction of an arrow. Electrode wires not shown in FIG. 1A are shown in FIG. 1B.

As shown in the drawings, this trench IGBT 11 is, for example, composed of two trench IGBT cells 12a and 12b, which are formed in two adjacent cell regions E1 and E2, respectively. First, an n− type drift layer 14 is formed on a p+ type semiconductor substrate 13. This n− type layer 14 may be epitaxially grown on the p+ type semiconductor substrate. Alternatively, p+ type diffusion layers are formed on both surfaces of the n− type semiconductor substrate, and the p+ type diffusion layer on one surface is removed to expose the n− type layer.

Next, a p type base layer 15 is formed by diffusion in this n− type layer 14. Further, a p+ type layer 16 to reduce parasitic resistance is diffused, and then an n+ type emitter layer 17 is formed by ion implantation.

Subsequently, trenches 18 are formed by a known method of anisotropic reactive ion etching so as to reach the n− type layer 14 through the p type base layer 15.

A gate insulating film 19 is formed by thermal oxidation so as to cover the inner surface of the trenches 18 and the top surface of the p type base layer 15, and then gate electrodes 20 of polysilicon are formed thereon by a known method of thermal CVD.

Finally, for electrical conduction, a collector electrode 21 is provided on a back surface of the p+ type semiconductor substrate 13, and emitter electrodes 23a and 23b and a gate wire 24 are formed by thermal CVD and photolithography with an insulating film, for example, an oxide film 22 interposed therebetween.

Each of trench patterns of the trench IGBT cells 12a and 12b includes a plurality of stripe trench lines 25 which are formed in parallel to each other and extended from one cell region E1 toward the other cell region E2. Ends 26a and 26b on one side of two adjacent trench lines 25a and 25b are connected to each other and ends 26c and 26d on the other side thereof are connected to each other to form rectangular frame trenches 27a, 27b, 27c, and 27d.

In the cell region E1 of the drawing, ends on the left side of adjacent two frame trenches 27a and 27b are connected to each other by a first connecting portion 28, and a portion between ends on the right side thereof is an unconnected portion 30, namely an open portion 30. Ends on the right side of next adjacent two frame trenches 27b and 27c are connected to each other by a second connecting portion 29, and a portion between ends on the left side thereof is another open portion 30. Furthermore, ends on the left side of adjacent two frame trenches 27c and 27d are connected to each other by another first connecting portion 28, and a portion between ends on the right side thereof is another open portion 30. Thus, each trench pattern has a shape in which the right and left ends of the adjacent frame trenches 27a to 27d are alternately connected to each other in an S-shape.

In other words, at least one of the first connecting portions 28 of the cell 12a faces one of the unconnected portions 30 of the cell 12b, and at least one of the unconnected portions 30 of the cell 12a faces the second connecting portion 29 of the cell 12b.

Accordingly, in the trench IGBT 11 thus constituted, portions which are not sandwiched by the trenches 18 are periodically formed in the region directly under the gate wire between the trench IGBT cells 12a and 12b.

Figure 2:
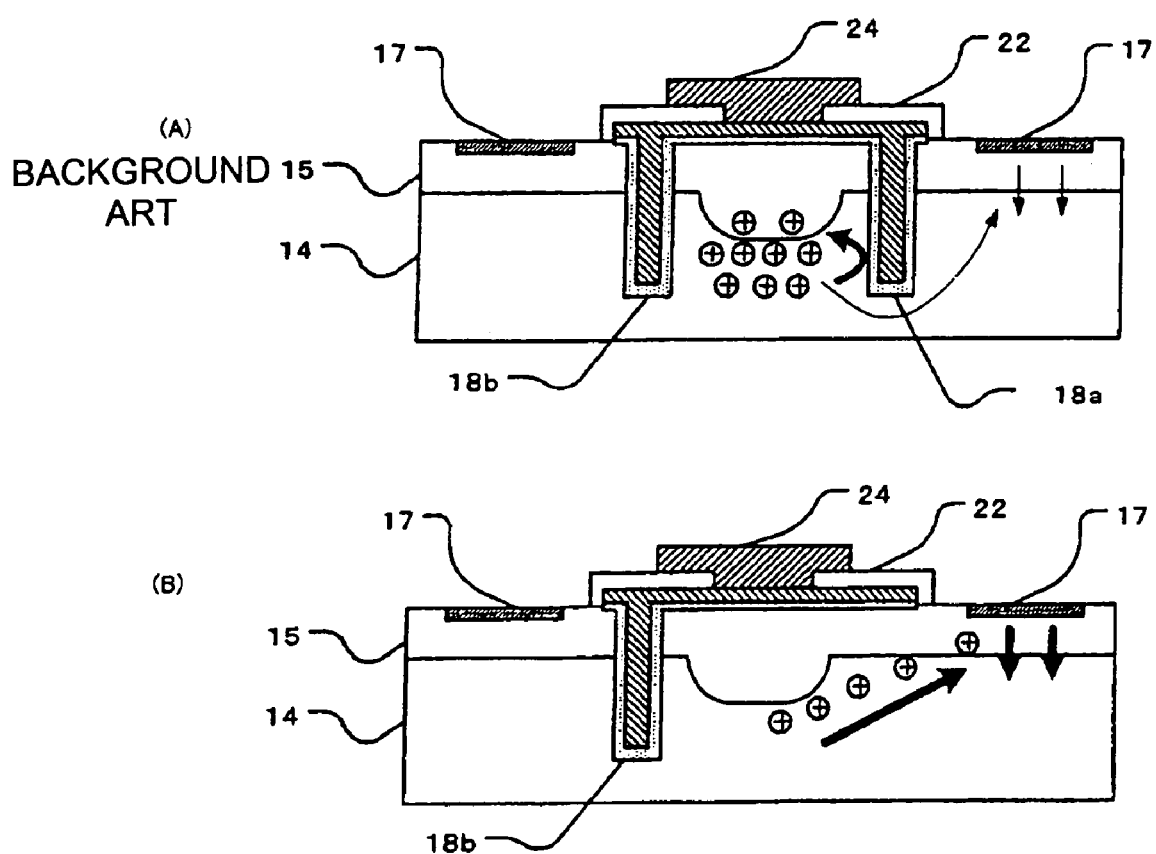
FIGS. 2A and 2B are views for explaining a principle of the first embodiment of the present invention, FIG. 2A being a sectional view showing a main portion directly under a gate wire between conventional trench IGBT cells, and FIG. 2B being a sectional view showing a main portion under a gate wire between trench IGBT cells according to the first embodiment of the present invention.

FIGS. 2A and 2B are views schematically showing an effect of the present invention. FIG. 2A is a sectional view showing a main portion directly under the gate wire between the conventional trench IGBT cells. FIG. 2B is a sectional view showing a main portion directly under the gate wire between the trench IGBT cells of the present invention. The same numerals are given to the same components as those of the above first embodiment in the drawings, and the description thereof is omitted.

In the conventional trench IGBT shown in FIG. 2A, holes which are accumulated directly under the gate wire when the trench IGBT is turned on are sandwiched between two trenches 18a and 18b to remain and are difficult to be discharged to the emitter electrode 17 even when the trench IGBT is turned off. By contrast, in the case where only one trench 18b is included, which is this embodiment shown in FIG. 2B, the accumulated holes are immediately discharged to the emitter electrode 17 when the trench IGBT is turned off.

As described above, in the semiconductor device according to the first embodiment of the present invention, the right and left ends of the trench frames are alternately connected so as to be continuously connected in an S-shape, and at least one of the connecting portions of the trench ends faces one of the unconnected portions thereof, sandwiching the gate wire between the trench IGBT cells.

Accordingly, the oxidation-induced stress at the ends of the trench lines is reduced, and holes which are accumulated directly under the gate wire when the IGBT is turned on are designed to be efficiently discharged from the emitter electrode through the unconnected portions of the gate when the IGBT is turned off. A semiconductor device with high latch-up immunity can be thus obtained without reducing the gate breakdown voltage.

Second Embodiment

Figure 3:
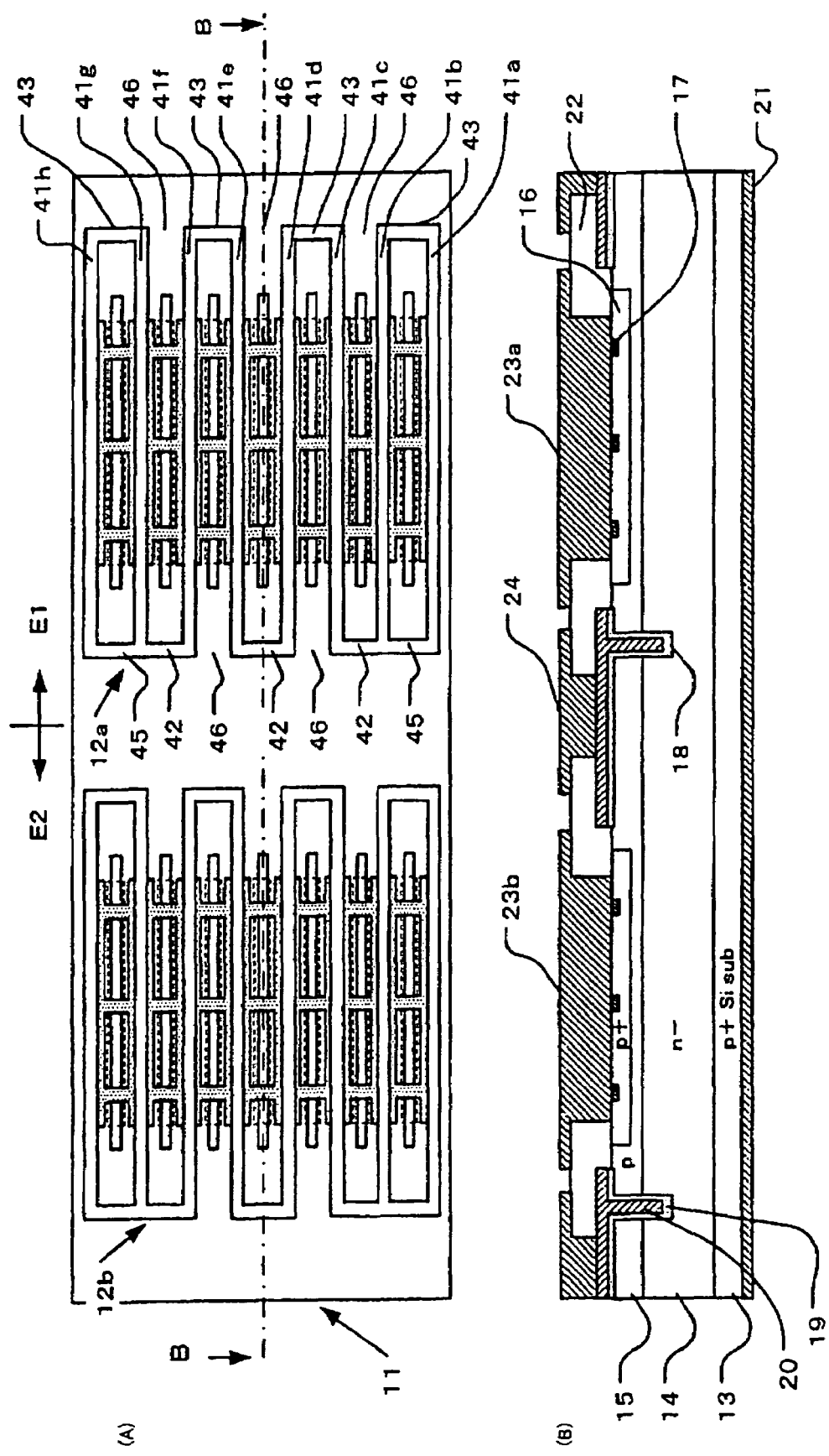
FIGS. 3A and 3B are views showing a trench IGBT according to a second embodiment of the present invention, FIG. 3A being a plan view, and FIG. 3B being a cross-sectional view taken along a line B—B of FIG. 3A.
Figure 4:
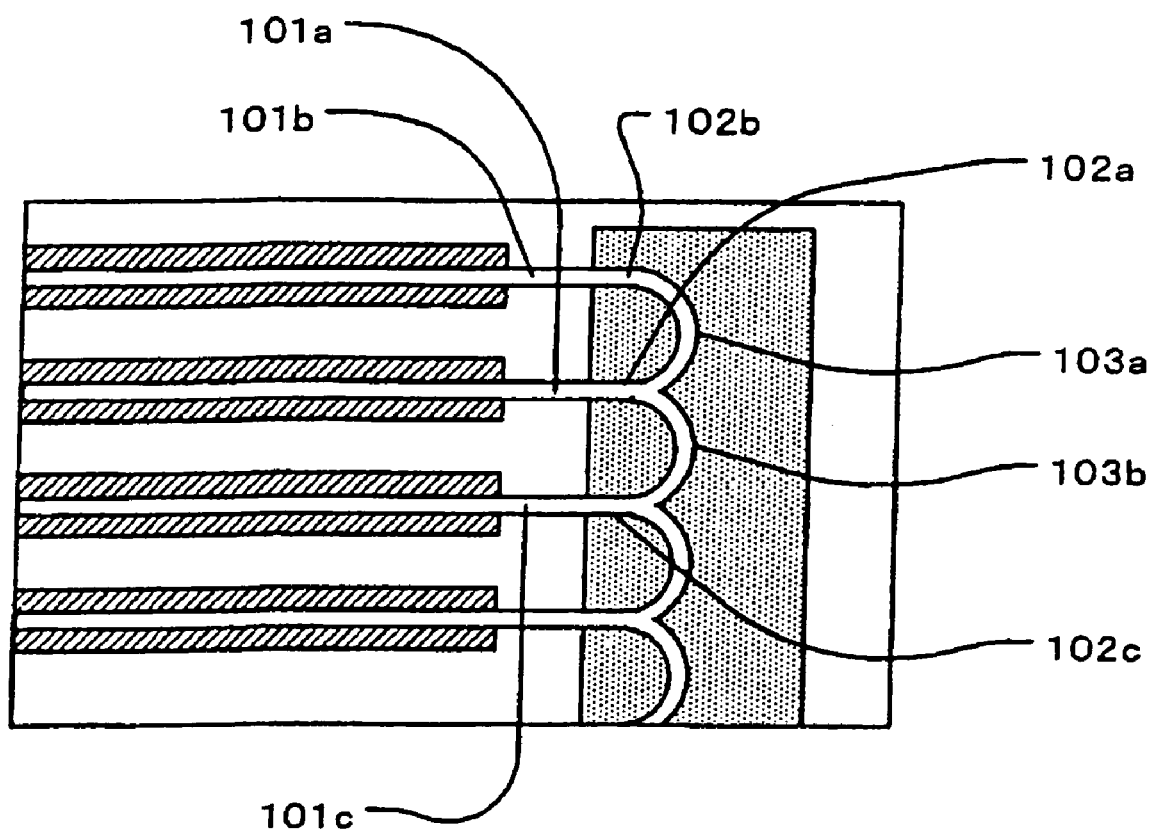
FIG. 4 is a view showing a main portion of a trench pattern of a conventional semiconductor device.
Figure 5:
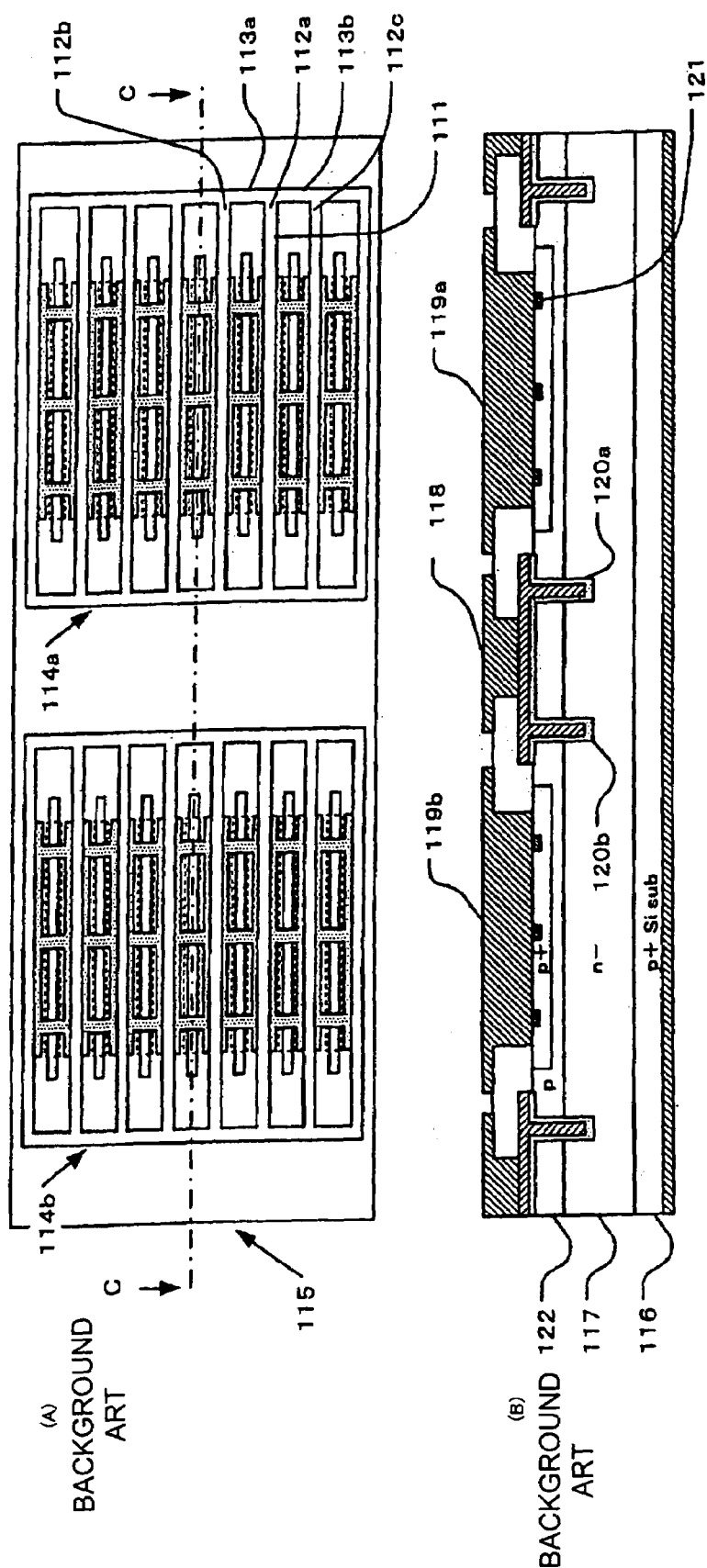
FIGS. 5A and 5B are views showing a conventional trench IGBT, FIG. 5A being a plan view, and FIG. 5B being a cross-sectional view taken along a line C—C of FIG. 5A.

FIGS. 3A and 3B are views showing a semiconductor device according to a second embodiment of the present invention. FIG. 3A is a plan view of a trench IGBT, and FIG. 3B is a cross-sectional view taken along a line A—A of FIG. 3A and viewed in a direction of an arrow. Electrode wires not shown in FIG. 3A are shown in FIG. 3B.

In this embodiment, the same numerals are given to the same components as those of the above first embodiment, and the description thereof is omitted.

As shown in the drawings, the second embodiment differs from the first embodiment in that the number of unconnected ends of the adjacent trench lines is increased.

Specifically, in the cell region E1 of the drawing, ends on the right side of adjacent trench lines 41a and 41b are connected by a second connecting portion 43, and the next ends on the left side of the trench line 41b and a trench line 41c adjacent thereto are connected by a first connecting portion 42. Further, right ends of the trench line 41c and a trench line 41d adjacent thereto are connected by another second connecting portion 43, and left ends of the trench line 41d and a trench line 41e adjacent thereto are connected by another first connecting portion 42. Furthermore, right ends of the trench line 41e and a trench line 41f adjacent thereto are connected by another second connecting portion 43, and left ends of the trench lines 41g and a trench line 41h adjacent thereto are connected by another first connecting portion 42. Right ends of the trench line 41f and a trench line 41g adjacent thereto are connected by another second connecting portion 43.

Portions between the right ends of the trench lines 41b and 41c, between the right ends of the trench lines 41d and 41e, between the right ends of the trench lines 41f and 41g, between the left ends of the trench lines 41c and 41d, and between the left ends 41e and 41f are unconnected portions 46, namely, open portions 46. The left ends of the trench lines 41a and 41b are connected to each other and the left ends of the trench lines 41g and 41h are connected to each other by respective third connecting portions 45. This forms an S-shape trench lines in which the right and left ends of the adjacent trench lines are alternately connected. Specifically, at least one of the first connecting portions 42 of the cell 12a faces one of the unconnected portions 46 of the cell 12b, and at least one of the unconnected portions 46 of the cell 12a faces one of the second connecting portions 43 of the cell 12b.

Accordingly, in the trench IGBT 11 thus constituted, the portions not sandwiched by the trenches 18 are periodically formed in the region directly under the gate wire between the trench IGBT cells 12a and 12b.

As described above, in the semiconductor device of the second embodiment of the present invention, the alternate right and left ends of the trenches are continuously connected to form an S shape, and the connecting portions and the unconnected portions of the adjacent trench ends between the trench IGBT cells face to each other, sandwiching the gate wire.

This reduces the oxidation-induced stress at the ends of the trenches and allows holes, which are accumulated directly under the gate wire when the IGBT is turned on, to be efficiently discharged from the emitter electrode through the unconnected portions of the gate when the IGBT is turned off. Therefore, a semiconductor device with high latch-up immunity is obtained without reducing the gate breakdown voltage.

In an experiment, when the trench pattern of the present invention was applied to a trench IGBT of a class with rated voltage and current of 600 V and 100 A, it was confirmed that the latch-up immunity could be increased by 30% or more.

In the aforementioned embodiments, the cases where there are eight trench lines have been described. However, the present invention is not limited to this and also can be applied to cases where the trench lines are increased or decreased.

Moreover, the description has been given of the cases where the ends on one side and ends on the other side are alternately connected by the connecting portions. The present invention is not limited to this, and can be variously modified.

In other words, in the present invention, it is sufficient if at least one connecting portion of the region on one side faces to the open portion of the region on the other side. Accordingly, a plurality of right/left ends of the trench lines may be connected by connecting portions. Moreover, the numbers of right and left ends may differ from each other.

Furthermore, the present invention can be similarly applied to a trench gate MOSFET. The trench pattern, a manufacturing process, and the like thereof are substantially the same as those of the trench IGBT, and drawings and detailed description thereof are omitted here.

As described above, according to the semiconductor device of the present invention, high gate breakdown voltage and high latch-up immunity can be stably obtained.

What is claimed is:

1. A semiconductor device comprising:
   a plurality of stripe trench lines which are provided in each of adjacent cell regions of a semiconductor layer in parallel and extended from a first cell region toward a second cell region;
   a gate insulating film formed in each of the trench lines; and
   a gate electrode embedded in each of the trench lines with the gate insulating film interposed therebetween,
   wherein, in each of the first and second cell regions, a first pair of stripe trench lines of the first cell region have adjacent ends on a side of the first cell region, the side facing the second cell region, the adjacent ends are connected to each other by connecting portions, and a second pair of stripe trench lines of the first cell region have on the side facing the second cell region adjacent ends separated by open portions and not connected along the side, and at least one of the connecting portions of the first cell region faces a corresponding open portion of the second cell region.

2. The semiconductor device according to claim 1, wherein both ends of a third pair of adjacent trench lines are respectively connected to each other to form frame trenches, and ends on one side of the adjacent frame trenches and ends on the other side thereof are alternately connected by connecting portions.

3. The semiconductor device according to claim 1, wherein at least ends on one side of adjacent inner trench lines and ends on the other side thereof are alternately connected by connecting portions.

4. The semiconductor device according to claim 1, wherein the semiconductor device is a trench insulated gate bipolar transistor.

5. The semiconductor device according to claim 1, wherein the semiconductor device is a trench insulated gate MOS transistor.

6. A semiconductor device comprising:
a plurality of frame trenches, in which adjacent both ends of a plurality of stripe trench lines are respectively connected to each other, the plurality of stripe trench lines being provided in each of adjacent cell regions of a semiconductor layer in parallel and extended from one cell region toward the other cell region;
a gate insulating film formed in each of the plurality of frame trenches; and
a gate electrode embedded in each of the plurality of frame trenches with the gate insulating film interposed therebetween,
wherein, in each of the cell regions, ends on one side of adjacent frame trenches are alternately connected by first connecting portions and the first connecting portions are not connected to each other on the one side, and ends on the other side of the adjacent frame trenches are alternately connected by second connecting portions and the second connecting portions are not connected to each other on the other side, and the first and second connecting portions of one cell region face relevant unconnected portions of the other cell region.

7. The semiconductor device according to claim 6, wherein the semiconductor device is a trench insulated gate bipolar transistor.

8. The semiconductor device according to claim 6, wherein the semiconductor device is a trench insulated gate MOS transistor.

9. A semiconductor device comprising:
a plurality of stripe trench lines which are provided in each of adjacent cell regions of a semiconductor layer in parallel and extended from one cell region toward the other cell region;
a gate insulating film formed in each of the plurality of trench lines; and
a gate electrode embedded in each of the plurality of trench lines with the gate insulating film interposed therebetween,
wherein, in each of the cell regions, both ends of adjacent outer trench lines are respectively connected to each other to form frame shapes, ends on one side of the adjacent inner trench lines are alternately connected by first connecting portions and the first connecting portions are not connected to each other on the one side, and ends on the other side of the adjacent inner trench lines are alternately connected by second connecting portions and the second connecting portions are not connected to each other on the other side, and the first and second connecting portions of one cell region face relevant unconnected portions of the other cell region.

10. The semiconductor device according to claim 9, wherein the semiconductor device is a trench insulated gate bipolar transistor.

11. The semiconductor device according to claim 9, wherein the semiconductor device is a trench insulated gate MOS transistor.

* * * * *